(12) United States Patent
Jain et al.

(10) Patent No.: US 12,073,877 B2
(45) Date of Patent: Aug. 27, 2024

(54) ROBUST CIRCUIT FOR NEGATIVE BIT LINE GENERATION IN SRAM CELLS

(71) Applicant: Taiwan Semiconductor Manufacturing Company, Ltd., Hsinchu (TW)

(72) Inventors: Sanjeev Kumar Jain, Kanata (CA); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 127 days.

(21) Appl. No.: 17/749,224

(22) Filed: May 20, 2022

(65) Prior Publication Data

US 2023/0037674 A1    Feb. 9, 2023

Related U.S. Application Data

(60) Provisional application No. 63/229,609, filed on Aug. 5, 2021.

(51) Int. Cl.
*G11C 11/419* (2006.01)
*G11C 5/14* (2006.01)

(52) U.S. Cl.
CPC ........... *G11C 11/419* (2013.01); *G11C 5/145* (2013.01)

(58) Field of Classification Search
CPC .............................. G11C 11/419; G11C 5/145
See application file for complete search history.

(56) References Cited

U.S. PATENT DOCUMENTS

| | | | |
|---|---|---|---|
| 6,950,358 B2 | 9/2005 | Lindstedt | |
| 7,800,959 B2* | 9/2010 | Childs | G11C 7/1078 |
| | | | 365/189.08 |
| 8,120,975 B2* | 2/2012 | Kenkare | G11C 11/419 |
| | | | 365/189.11 |
| 8,174,867 B2 | 5/2012 | Wu | |
| 8,837,229 B1* | 9/2014 | Dubey | G11C 7/1096 |
| | | | 365/189.11 |
| 9,281,030 B2* | 3/2016 | Dubey | G11C 11/419 |
| 9,355,710 B2* | 5/2016 | Gong | G11C 11/419 |
| 9,728,250 B2 | 8/2017 | Chung | |

(Continued)

FOREIGN PATENT DOCUMENTS

| | | |
|---|---|---|
| JP | 2010218617 | 9/2010 |
| KR | 20180054779 | 5/2018 |
| TW | I523009 | 2/2016 |

OTHER PUBLICATIONS

Taiwanese Office Action; Application No. 111128343; Dated May 10, 2023.

(Continued)

*Primary Examiner* — Son L Mai
(74) *Attorney, Agent, or Firm* — Jones Day

(57) ABSTRACT

Systems and methods are provided for limiting a negative bit line voltage in a SRAM cell. A voltage limiter circuit may be implemented in a write driver to control the magnitude of negative voltage imposed on a bit line. The voltage limiter circuit can produce the required magnitude of negative bit line voltage at lower operating voltage levels. The voltage limiter circuit can also limit the magnitude of negative bit line voltage to not exceed a predetermined value. The reduction of the magnitude of the negative bit line voltage can reduce the active power of a SRAM cell.

20 Claims, 15 Drawing Sheets

(56) References Cited

U.S. PATENT DOCUMENTS

| | | | |
|---|---|---|---|
| 10,672,461 B2* | 6/2020 | Gong | G11C 7/12 |
| 2007/0268738 A1 | 11/2007 | Heinrich-Barna et al. | |
| 2017/0294223 A1 | 10/2017 | Zhang et al. | |

OTHER PUBLICATIONS

Korea Office Action; Application No. 10-2022-0074986; Dated Feb. 23, 2024.

Korea Office Action; Application No. 10-2022-0074986; Dated Mar. 14, 2024.

* cited by examiner

| SEL[0:1] 702 | VAST With HV=1 |
|---|---|
| 0,0 | Between 0.8 V and 1V |
| 0,1 | 1.0V |
| 1,0 | 0.8V |
| 1,1 | 1.1V |

| SEL[0:1] 1303 | NBLB_C 302 With HV=1 1302 |
|---|---|
| 0,0 | 1.2V |
| 0,1 | 1V |
| 1,0 | 0.8V |
| 1,1 | Between 0.8 V and 1V |

1600

ROBUST CIRCUIT FOR NEGATIVE BIT LINE GENERATION IN SRAM CELLS

CROSS-REFERENCE TO RELATED APPLICATIONS

This application claims priority to U.S. Provisional Application No. 63/229,609, filed Aug. 5, 2021, entitled "Systems and Methods for Bitline Generation in SRAMs," which is incorporated herein by reference in its entirety.

TECHNICAL FIELD

The technology descripted in this disclosure generally relates to SRAM cells and particularly write driver operation in SRAM cells.

BACKGROUND

At a given memory cell supply voltage, a minimum magnitude of voltage on a bit line may be used in order to perform a write operation. For some SRAM cells, including dual port SRAM cells and high density single SRAM cells, this voltage requirement is negative.

BRIEF DESCRIPTION OF THE DRAWINGS

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
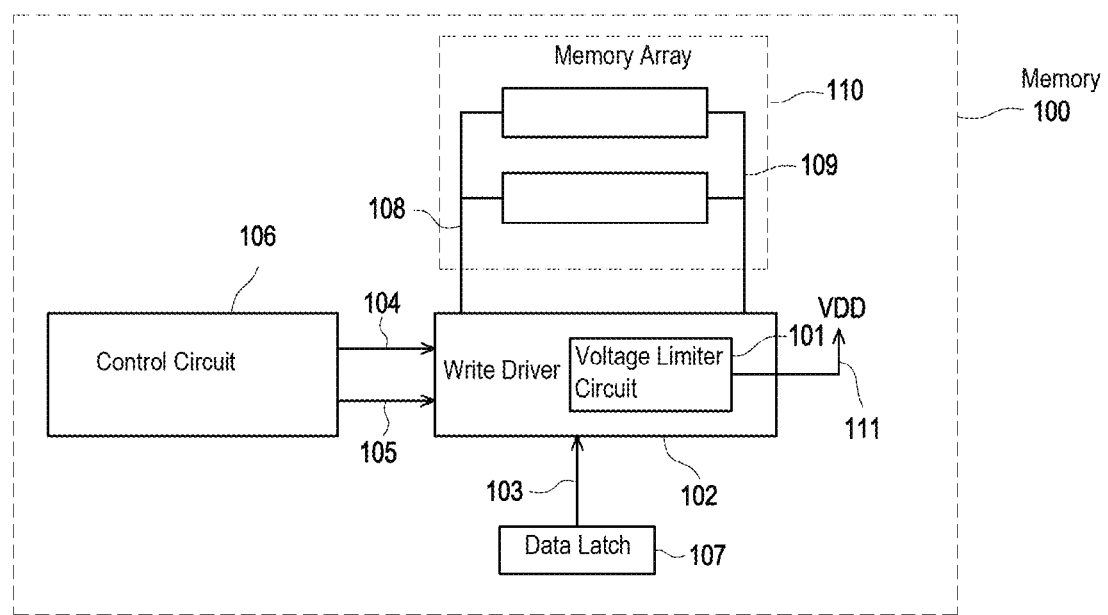
FIG. 1 is a diagram of an exemplary memory architecture in a SRAM cell in accordance with embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the circuit. Some of the features described below can be replaced or eliminated for different embodiments. Although some embodiments are discussed with operations performed in a particular order, these operations may be performed in another logical order.

At a given memory cell supply voltage, a minimum magnitude of voltage on a bit line may be used to perform a write operation. For some SRAM cells, including dual port SRAM cells and high density single SRAM cells, this voltage requirement is negative. A negative bit line voltage may cause a reliability issue in devices, such as negative bias temperature instability, at certain operating conditions. For example, negative bias temperature instability may be induced when a high magnitude of negative bit line voltage and a high memory cell supply voltage are present. In some cases, such as a high magnitude of negative voltage on a bit line, a high electric field is created for the unselected SRAM cell in a column between the source and gate. This may cause a reliability issue in the device such as negative bias temperature instability. Prolonged negative bias temperature instability can shorten the lifetime of the device.

Some circuits may work well to generate the required negative bit line voltage at low voltages. However, certain circuits may also produce a high magnitude of negative bit line voltage at high voltages, where this high magnitude may be unnecessary in order to perform a successful write operation. For example, when the memory is operated at 0.6 V, the negative bit line voltage generated may be −150 mV, which may be desirable for operation of the memory circuit. However, when the memory supply voltage is operated at 1.3 V (e.g., during high demand periods), the negative bit line voltage may be −300 mV, which may cause reliability issues within the device.

Systems and methods as described herein can, in embodiments, reduce the magnitude of negative bit line voltage when a high memory cell supply voltage is present. The systems and methods described herein can also reduce the active power of a SRAM cell due to this negative voltage. The subject disclosure herein provides several embodiments for reducing the magnitude of a negative bit line voltage at a high operating voltage.

FIG. 1 is a diagram of an exemplary memory architecture in a SRAM cell, in accordance with embodiments. In one embodiment, the memory architecture includes a control circuit 106 that generates a write signal 105 and a negative bit line input signal 104. The memory circuit also includes a write driver 102 that is configured to receive the write signal 105 and negative bit line input signal 104, as well as a data signal 103 from a data latch 107. During a write operation, the write driver 102 is configured to apply a high voltage to one of two bit lines 108, 109 and a low voltage to the other bit line, depending on whether a '0' or '1' is being written to a memory cell. The write driver includes a voltage limiter circuit 101 that is configured to control a voltage at a first node of a negative bit line (see FIG. 3). For example, the voltage limiter circuit may be configured to limit a magnitude of the negative bit line voltage applied to one of two bit lines (108, 109) of a memory array 110. In the embodiment shown in FIG. 1, the memory array 110 is configured to receive the negative bit line voltage on one of lines 108, 109 and to perform a write operation to one or more of the memory cells in memory array 110.

Figure 2:
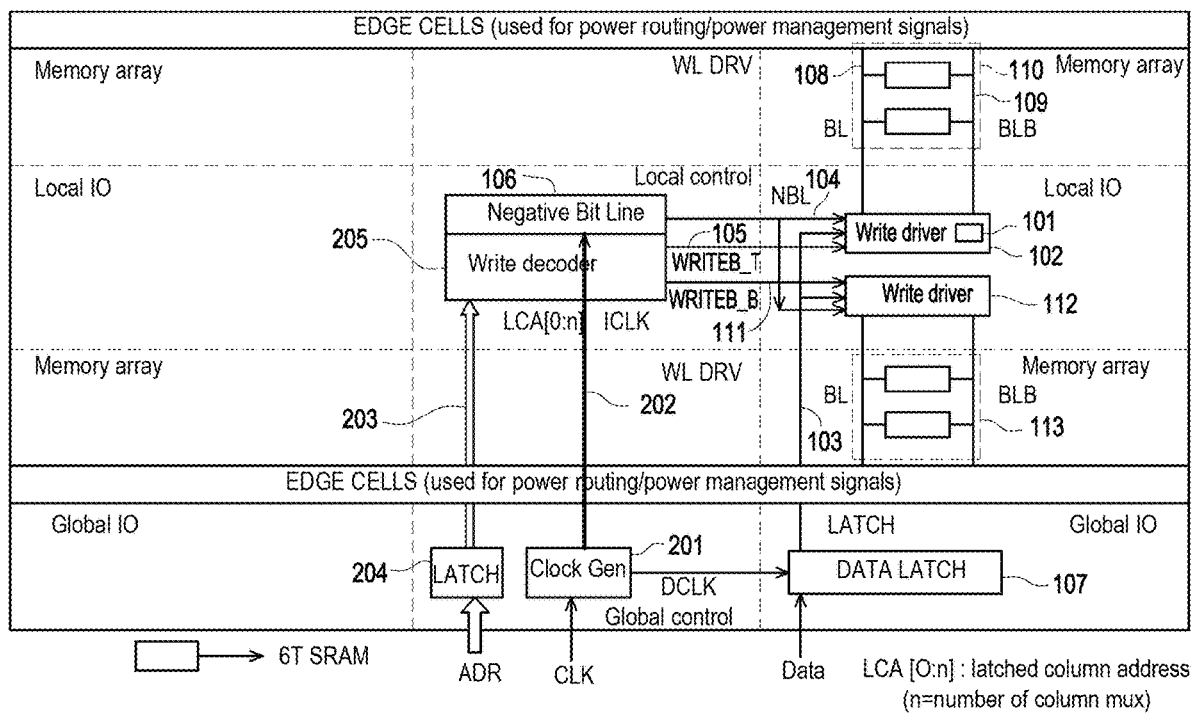
FIG. 2 is a detailed diagram of a proposed memory architecture in a SRAM cell in accordance with embodiments.

FIG. 2 is a detailed diagram of a proposed memory architecture in a SRAM cell, in accordance with embodiments. The memory architecture may include a latch 204, a clock 201, a data latch 107, a control circuit 106, write drivers 102, and memory arrays 110. In one embodiment, the control circuit 106 is configured to receive a clock signal 202 from the clock 201, an address signal 203 from the latch 204, and to generate a negative bit line input signal NBL 104 and write signals (105, 106). The clock signal 201 is utilized for timing coordination within the control circuit 106, and the address signal 203 from the latch 204 is used to determine the location in the memory cell at which the data will be written. A write decoder within the control circuit 106 may be configured to decode the address signal 203 and generate one or more write signals 105. In one example, one write signal WRITEB_T 105 is enabled for accessing a top memory array 110, and another write signal WRITEB_B 111 is enabled for accessing a bottom memory array 113. Each write driver 102 may be configured to receive a negative bit line input signal NBL 104, a write signal (105, 106) and a data signal LDATA 103 from the data latch 107 and to generate a negative bit line voltage to one of two bit lines (108, 109) of a corresponding memory array (110, 113). The data signal LDATA 103 from the data latch 107 may determine the data (i.e., a "0" or a "1") that will be written to the memory cell. The write driver 102 includes a voltage limiter circuit 101 that may be configured to control a voltage at a first node of a negative bit line (108, 109). For example, the voltage limiter circuit 101 may be configured to limit a magnitude of the negative bit line voltage on one of the two bit lines (108, 109) of the memory cell such that the magnitude does not exceed a predefined threshold.

Figure 3:
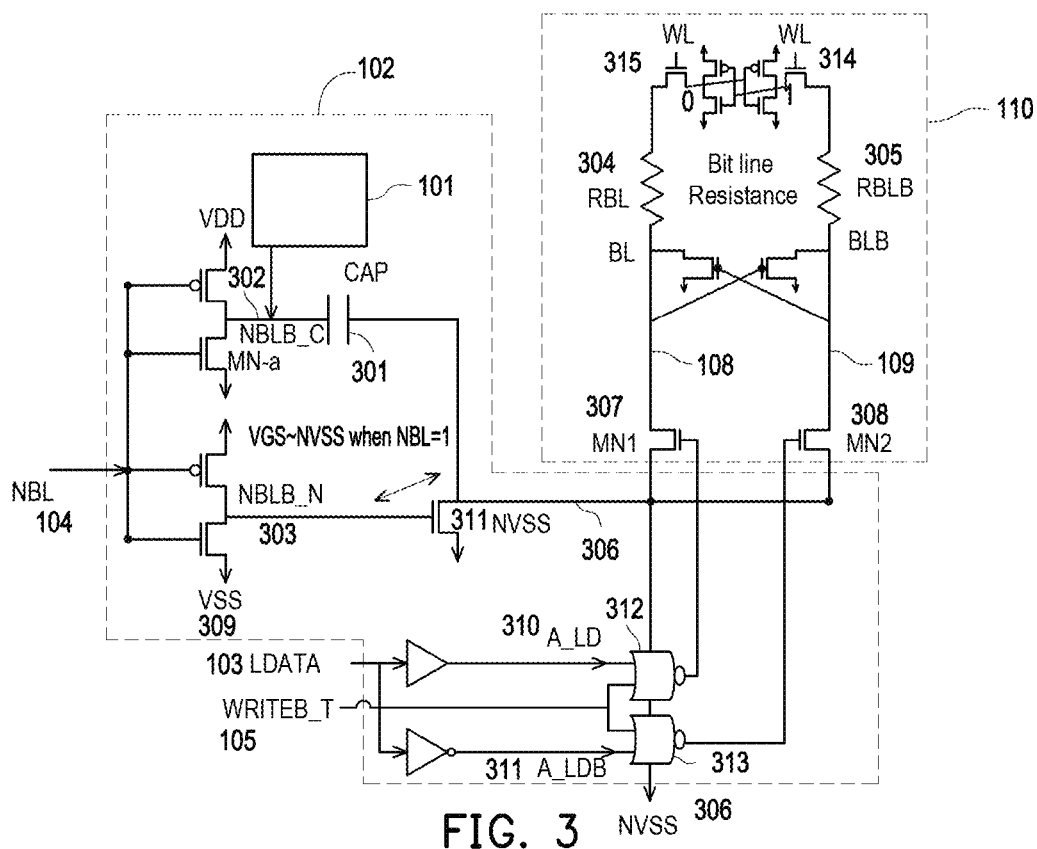
FIG. 3 is a diagram of a voltage limiter circuit implemented within a write driver and a memory array in accordance with embodiments.

FIG. 3 is a diagram of a memory architecture, including an implementation of the voltage limiter circuit 101, in accordance with embodiments. In the example depicted in FIG. 3, the voltage limiter circuit 101 is implemented within the write driver 102 and is coupled to a first node of active low negative bit line NBLB_C 302. The write driver 102 also includes a capacitor 301 that is configured to provide a transition of the negative bit line voltage over a period of time. The voltage limiter circuit 101 may control the magnitude of the negative bit line voltage such that the magnitude does not exceed a predefined threshold, but is not limited to a magnitude below that which is necessary for performing a write operation in a memory cell, for example a SRAM cell. Several different embodiments of a voltage limiter circuit 101 are disclosed in the present example, all of which are within the scope of the invention.

FIG. 3 may be further understood in conjunction with a discussion of an example of a write operation. After the clock signal 202 rises, WRITEB_T 105 may go to logic low ("0"). If, at this time, the data to be written LDATA, is at logic high ("1"), A_LD 310 will be at logic high ("1") as well. By contrast, A_LDB will be at logic low ("0"). Thus, the output of logic (NOR) gate 312 will be at logic low ("0"), and transistor MN1 307 will be disabled. However, the output of logic (NOR) gate 313 will be at logic high ("1"), and transistor MN2 308 will be enabled. Thus, second active low negative bit line BLB 109 will be at logic low ("0") because this second active low negative bit line BLB 109 will be coupled to ground source node NVSS 306. In some cases, a negative voltage is imposed on this node NVSS 306 to increase the gate to source voltage of a pass gate transistor (314, 315) to perform a write operation. This negative voltage may be generated using the negative bit line input signal NBL 104. As NBL 104 goes to logic high ("1"), a first node NBLB_C 302 on the active low negative bit line will fall to logic low ("0"). Thus, negative voltage will be coupled to ground source node NVSS 306. The magnitude of negative voltage coupled to ground source node NVSS 306 may depend on the value of the capacitor 301.

During some operations, the memory may be operating at a high voltage level. A memory may be used in a microprocessor, for example. During some operations, a processor may have an increased processing demand, as understood by one skilled in the art. This may be the case when a processor is operating within an application involving many computations, such as the operation of a video game. During this increased demand, the processor may operate at a high frequency. This may cause an increase in voltage of individual components of the processor, such as a memory, as understood by one skilled in the art. By contrast, a processor may have a low processing demand. For example, a low processing demand may be present when a processor is operating within an application in which administrative tasks are being performed. This low processing demand may result in a decrease in voltage of components of the processor, such as a memory. A high operating voltage may be, for example, above 0.9 V. A low operating voltage may be, for example, lower than 0.9 V. A low operating voltage is referred to throughout the disclosure to refer to memory operating voltages that are below a predetermined value, while a high operating voltage is referred to throughout the disclosure to refer to memory operating voltages that are above a predetermined value. The specific predetermined value may be different depending on the embodiment of the invention that is implemented.

At a high operating voltage, the gate to source voltage of a pass gate transistor (314, 315) may be at a level that is sufficient to perform a write operation. However, the high gate to source voltage of a pass gate transistor (314, 315) may diminish reliability in a memory device. For example, a prolonged high gate to source voltage may cause negative bias temperature instability, as discussed above. Voltage limiter circuit 101 may reduce the magnitude of this negative voltage at ground source node NVSS 306 at a high operating voltage of the memory, while not significantly impacting the negative voltage at ground source node NVSS 306 at a low operating voltage of the memory. In addition to mitigating the reliability issue in a memory device, voltage limiter circuit 101 may also reduce the active power of a SRAM cell due to this lower voltage at a higher operating voltage mode.

Figure 4:
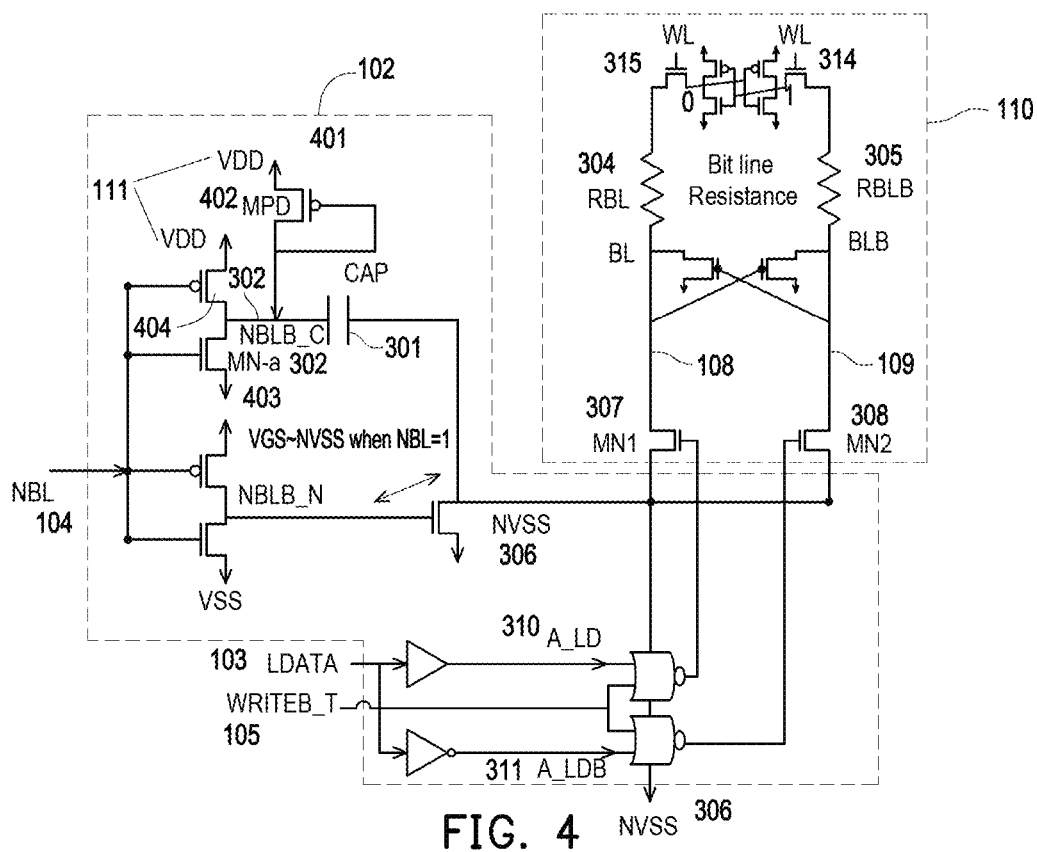
FIG. 4 is a diagram of a diode voltage limiter circuit implemented within a write driver in accordance with embodiments.

FIG. 4 is a diagram of one embodiment of the voltage limiter circuit 101, in accordance with embodiments. In this embodiment, the voltage limiter circuit 101 comprises a diode circuit 401 which may be enabled during a high operating voltage mode of memory and disabled during a low voltage mode of memory. In one example, the diode circuit is coupled to a first node NBLB_C 302 on an active low negative bit line. This node 302 may be configured to provide a transition of a negative bit line voltage to a negative bit line over a period of time. In one embodiment, the diode circuit 401 comprises a transistor 402. The source terminal of this transistor 402 may be coupled to a supply voltage node VDD 111, with the drain terminal of the transistor 402 coupled to the first active low negative bit line node 302. The diode circuit 401 may be configured to clamp the first node NBLB_C 302 at a predefined threshold voltage. For example, negative bit line input signal NBL 104 may increase to logic high ("1") during the commencement of a write operation. Since this negative bit line input signal NBL 104 is coupled to the first node NBLB_C 302 through a transistor with an inverted gate terminal, as shown in FIG. 4, this will cause the voltage at the first node NBLB_C 302 to decrease. When the voltage at node NBLB_C 302 decreases to a level that generates a differential voltage across the transistor 402 in the diode circuit 401 that meets a threshold value of transistor 402, the diode circuit 401 will couple supply voltage VDD 111 to the first node NBLB_C 302. In this way, the voltage at the first node NBLB_C 302 will be prevented from decreasing below a particular constant value.

In an embodiment of the present disclosure, the diode circuit 401 is configured to clamp the node NBLB_C 302 on the active low negative bit line at a predefined voltage level at a high operating voltage mode. In this way, a lower magnitude of negative voltage is coupled at a ground source node NVSS 306 at a high operating voltage mode. The value of this predefined voltage level may be dependent upon the size and threshold voltage of a transistor 402 within the diode circuit 401, as well as a second, separate transistor 403 that is also coupled to the first node 302 on an active low negative bit line. With the voltage at the first node NBLB_C 302 clamped, the magnitude of negative voltage at the ground source node NVSS 306 will be reduced. This is because the voltage at the anode of capacitor 301 will be clamped at a higher level, and thus a voltage drop across the capacitor 301 will result in a voltage at the cathode of capacitor 301 that is at a higher level than it would be without the presence of the diode circuit 401. Since the cathode of capacitor 301 is coupled directly to the ground source node NVSS 306, the voltage at ground source node will be at a higher level, or the magnitude of negative voltage at ground source node NVSS 306 will be lower, with the presence of diode circuit 401. The amount by which the magnitude of negative voltage at ground source node NVSS 306 may be reduced with the diode circuit 401 may be determined by many factors such as characteristics of the capacitor 301, the transistor 402, and transistor 403. The appropriate characteristics of these components may be determined through the use of simulations and calculations, as further described in the discussion of FIG. 6. For example, at a high operating voltage of 1.2V, the magnitude of negative voltage at ground source node NVSS 306 may be reduced to about −150 mV. However, at a low operating voltage of, for example, 0.6V, the diode circuit 401 may be disabled, and the voltage at node NBLB_C may be at a voltage level of about −100 mV.

Figure 5:
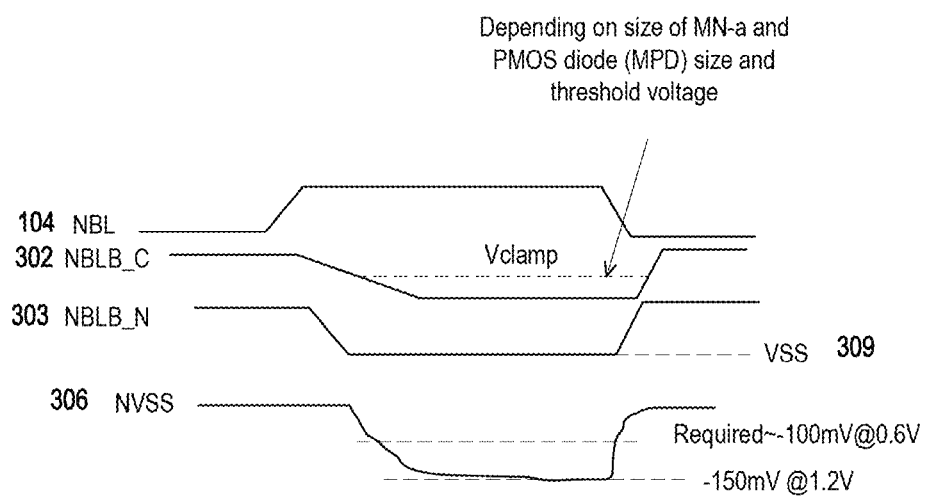
FIG. 5 is a timing diagram of the waveforms of various signals within a diode voltage limiter circuit in accordance with embodiments.

FIG. 5 is a timing diagram of the waveforms of the negative bit line input signal NBL 104, the voltage of the first negative bit line node NBLB_C 302, the voltage at the second negative bit line node 303, and the voltage at the ground source node NVSS 306, in accordance with embodiments. In the example shown in FIG. 5, the negative bit line input signal NBL 104 begins to rise. For example, the negative bit line input signal NBL 104 may begin to rise after the control circuit 106 indicates an initiation of a write operation. A write operation may be initiated by a signal from a user of a device with an implemented memory circuit, for example, or a write operation may be automatically initiated, depending on an application. After the negative bit line input signal begins to rise, the voltage of the first negative bit line node NBLB_C 302 begins to decrease. This is because the negative bit line signal NBL 104 is coupled to an inverted gate terminal of a transistor 404 that is also coupled to the first negative bit line node NBLB_C 302, as shown in FIG. 4. Thus, when the negative bit line input signal NBL 104 increases to logic high ("1"), the transistor 404 ceases to couple voltage from supply voltage VDD 111 to first node NBLB_C 302, causing the voltage at this first node NBLB_C 302 to decrease. The voltage of the first negative bit line node NBLB_C 302 may decrease over a longer period of time than the negative bit line input signal rises, due to the effect of the capacitor 301. The voltage at the second negative bit line node NBLB_N 303 may also decrease after the negative bit line input signal NBL 104 rises because this second node 303 is coupled to a transistor, the gate terminal of which is coupled to an inverted negative bit line input signal NBL 104. Thus, when the negative bit line input signal NBL 104 increases to logic high ("1"), the transistor ceases to couple voltage from supply voltage VDD 111 to the second negative bit line node NBLB_N 303, causing the voltage at this second node NBLB_N 303 to decrease. Ground source node NVSS 306 is also shown in FIG. 5. Because the diode voltage limiter circuit 401 clamps the node of an active low negative bit line NBLB_C 302 at a predefined voltage level, the magnitude of the voltage at ground source node NVSS 306 is limited. In one example, the magnitude of the voltage at ground source node NVSS 306 is limited because the diode circuit 401 is configured to clamp the magnitude of voltage at node NBLB_C 302, as discussed above. Thus, the voltage drop from this node 302 caused by the capacitor 301 may also result in a limited voltage at ground source node NVSS 306. In this example, the voltage at NVSS 306 is limited to not decrease below −150 mV at a memory operating voltage of 1.2 V.

Figure 6:
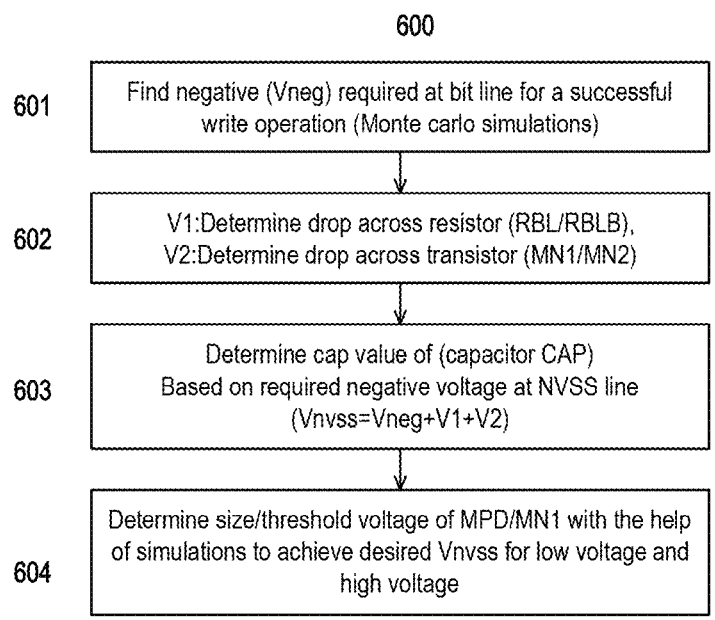
FIG. 6 is a diagram of a flow chart for deciding components within a diode voltage limiter circuit in accordance with embodiments.

FIG. 6 is a diagram of a flow chart to decide the appropriate size of the separate transistor MN-a 403 and the MPD transistor 402, in accordance with embodiments. The first step 601 to determine the appropriate size of the MN-a 403 and MPD 402 transistor is to determine the negative voltage that is required at a bit line for a successful write operation. These can be determined by Monte Carlo simulations, as understood by one skilled in the art. The second step 602 of deciding the appropriate size of MN-a 403 and MPD 402 transistors is to determine the voltage drop across a resistance 304 of a first bit line 108 and the voltage drop across a resistance 305 of a second, active low negative bit line 109. The second step 602 also includes determining the voltage drop across the MN1 transistor 307, as well as the voltage drop across the MN2 transistor 308. The third step 603 is to determine the value of the capacitor 301 to be used based on the required negative voltage at the ground source voltage node NVSS 306. This determination involves the equation VNVSS=$V_{neg}$+V1+V2, where V1 and V2 are determined from the second step. The fourth step 604 involves determining the size and threshold voltage of the MPD 402 and MN-a 403 transistors. This can be accomplished with the help of simulations to achieve the desired voltage at NVSS 306 for low voltage and high voltage.

Figure 7:
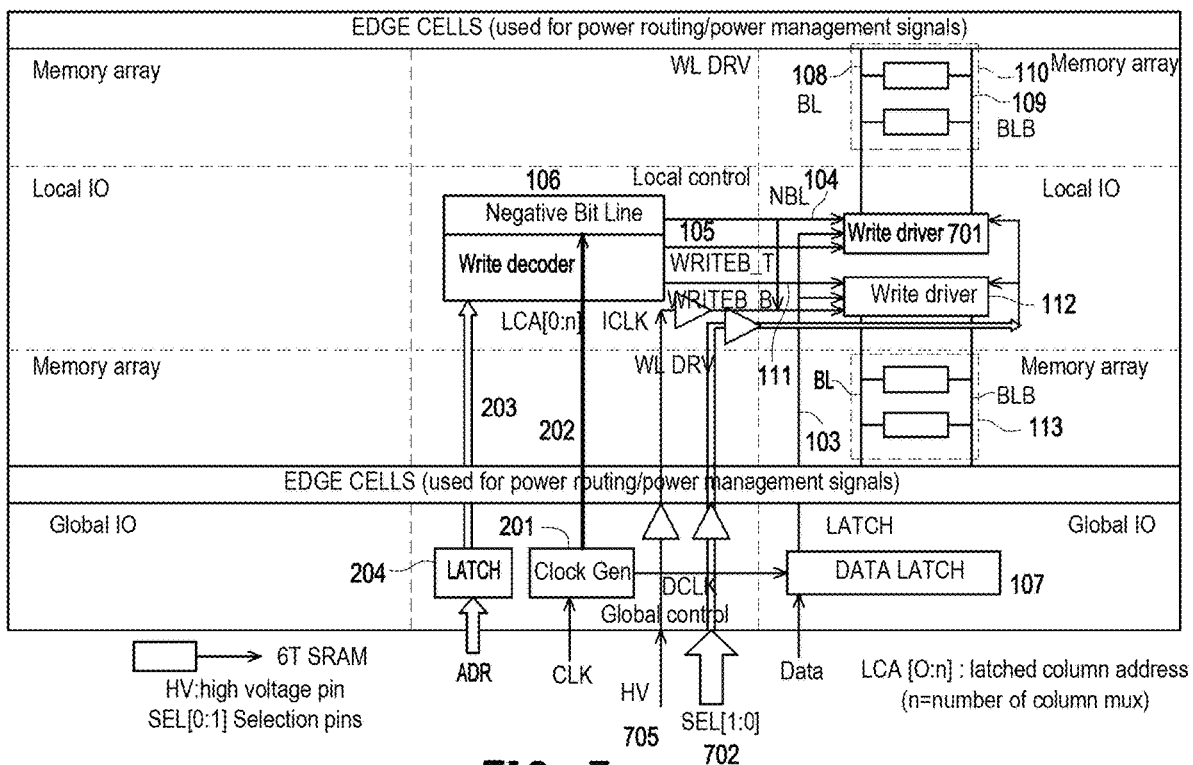
FIG. 7 is a detailed diagram of a proposed memory architecture in a SRAM cell in accordance with embodiments.

FIG. 7 is a detailed diagram of a proposed memory architecture embodiment in a SRAM cell, in accordance with embodiments. The memory architecture may include a latch 204, a clock 201, a data latch 107, a control circuit 106, write drivers 102, and memory arrays 110. In the example shown in FIG. 7, the control circuit 106 is configured to receive a clock signal 202 from the clock 201, an address signal 203 from the latch 204, and to generate a negative bit line input signal NBL 104 and one or more write signals (105, 111). Each write driver (102, 112) may be configured to receive a negative bit line input signal NBL 104 and a write signal (105, 111) and to generate a negative bit line voltage to one of two bit lines (108, 109) of a corresponding memory array 110. The write drivers 102 may also be configured to receive a data signal 105 from the data latch 107, a high voltage signal HV 705, and a plurality of voltage threshold selection signals 702. In the embodiment of FIG. 7, the high voltage signal HV 705 is used to indicate whether the SRAM cell is operating in a high operating voltage mode or a low operating voltage mode. For example, a high voltage signal HV 705 may be set to logic high ("1") when the operating voltage of the SRAM cell is above a predetermined value, and logic low ("0") when the operating voltage of the SRAM cell is below a predetermined value. The plurality of voltage threshold selection signals 702 may be used to set the voltage level at a negative bit line node, as described in the discussion of FIG. 9.

A write decoder 205 within the control circuit 106 may be configured to decode the address signal 203 and generate one or more write signals 105. In one example, one write signal WRITEB_T 105 is enabled for accessing a top memory array 110, and another write signal WRITEB_B 111 is enabled for accessing a bottom memory array 113. The data signal LDATA 103 from the data latch 107 may determine the data (i.e., a "0" or a "1") that will be written to the memory cell. The write driver 102 includes a voltage limiter circuit 701 that may be configured to control a voltage at a first node of a negative bit line (108, 109). For example, the voltage limiter circuit 701 may be configured to limit a magnitude of the negative bit line voltage on one of the two bit lines (108, 109) of the memory cell such that the magnitude does not exceed a predefined threshold, as shown in the discussion of FIG. 8.

Figure 8:
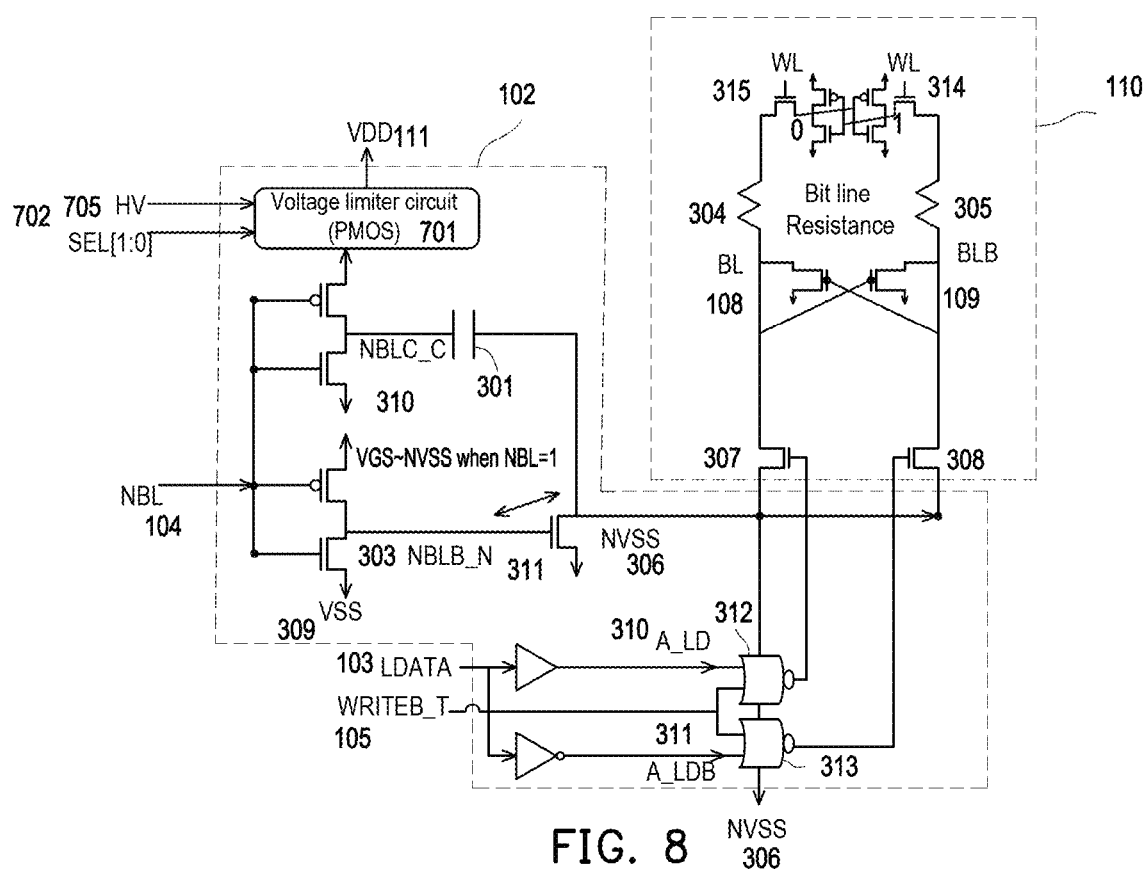
FIG. 8 is a diagram of a PMOS voltage limiter circuit implemented within a write driver in accordance with embodiments.

FIG. 8 is a diagram of an embodiment of a memory architecture in which the voltage limiter circuit is a PMOS voltage limiter circuit 701, in accordance with embodiments. The PMOS voltage limiter circuit 701 may limit the magnitude of the negative bit line voltage on one of two bit lines (108, 109) by first limiting the magnitude of voltage at first node NBLB_C 302. When the voltage at first node NBLB_C 302 is limited, this will also limit the voltage at ground source node 306 after a voltage drop across capacitor 301. The ground source node NVSS 306 may be coupled to one of two bit lines (108, 109) as shown in FIG. 8, thus also limiting this voltage. The PMOS voltage limiter circuit 701 may be coupled to a negative bit line configured to clamp NBLB_C 302 voltage at a voltage less than the supply voltage VDD 111. The voltage limiter circuit 701 may also be coupled to supply voltage node VDD 111, and receive the high voltage signal HV 705 and the plurality of voltage threshold selection signals 702.

FIG. 8 may be further understood in conjunction with a discussion of an example of a write operation. After the clock signal 202 rises, WRITEB_T 105 may go to logic low ("0"). If, at this time, the data to be written LDATA, is at logic high ("1"), A_LD 310 will be at logic high ("1") as well. By contrast, A_LDB will be at logic low ("0"), because LDATA 103 is coupled to a buffer, and A_LDB is an inverted output of that buffer. Thus, the output of logic (NOR) gate 312 will be at logic low ("0"), and transistor MN1 307 will be disabled. However, the output of logic (NOR) gate 313 will be at logic high ("1"), and transistor MN2 308 will be enabled. Thus, second active low negative bit line BLB 109 will be at logic low ("0") because this second active low negative bit line BLB 109 will be coupled to ground source node NVSS 306. In some cases, a negative voltage is imposed on this node NVSS 306 to increase the gate to source voltage of a pass gate transistor (314, 315) to perform a write operation. This negative voltage may be generated using the negative bit line input signal NBL 104. As NBL 104 goes to logic high ("1"), a first node NBLB_C 302 on the active low negative bit line will fall to logic low ("0"). Thus, negative voltage will be coupled to ground source node NVSS 306. The magnitude of negative voltage coupled to ground source node NVSS 306 may depend on the value of the capacitor 301.

During some operations, the memory may be operating at a high voltage level. For example, a high operating voltage may be present when the memory is performing many operations at a high frequency. At a high operating voltage, the gate to source voltage of a pass gate transistor (314, 315) may be at a level that is sufficient to perform a write operation. The gate to source voltage of pass gate transistor 314 may be sufficient, for example, because the source terminal of pass gate transistor 314 is coupled to negative bit line 109, which may be at a high magnitude of negative voltage, causing the voltage between the gate and source terminals of pass gate transistor 314 to also be at a high level. However, the high gate to source voltage of pass gate transistor 314 may diminish reliability in a memory device, as further discussed in the description of FIG. 3. The PMOS voltage limiter circuit 701 may reduce the magnitude of this negative voltage at ground source node NVSS 306 at a high operating voltage of the memory, while not significantly impacting the negative voltage at ground source node NVSS 306 at a low operating voltage of the memory. In addition to mitigating the reliability issue in a memory device, voltage limiter circuit 101 may also reduce the active power of a SRAM cell due to this lower voltage at a higher operating voltage mode. For example, the active power may be reduced by decreasing the power that is consumed by the bit line resistance (304, 305) as a result of decreasing the voltage on the respective bit line (108, 109).

Figure 9:
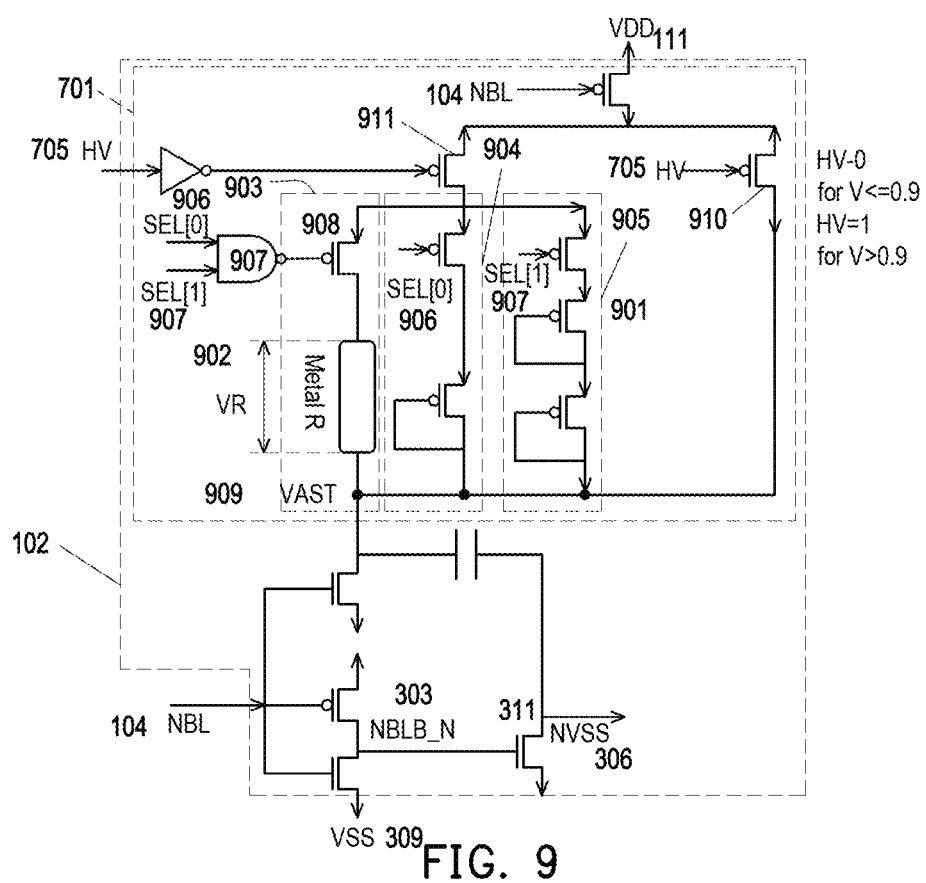
FIG. 9 is a detailed diagram of an embodiment of the PMOS voltage limiter circuit in accordance with embodiments.

FIG. 9 is a detailed diagram of an embodiment of the PMOS voltage limiter circuit 701, in accordance with embodiments. In the embodiment of FIG. 9, the PMOS voltage limiter 701 circuit includes an array of transistors. In one embodiment, the array of transistors includes a first column of transistors 903, a second column of transistors 904, and a third column of transistors 905. The PMOS voltage limiter circuit can receive a plurality of voltage threshold selection signals (906, 907). For example, voltage threshold selection signals SEL 906 and SEL 907 can serve as inputs to a logic (AND) gate 907. The output of this logic (AND) gate 907 can be inverted and serve as an input to an inverted gate terminal of a transistor 908 in the first column of transistors 903. In an embodiment of the present disclosure, the first column of transistors 903 also includes a metal resistor 902 that is coupled in series with the transistor 908. Voltage threshold selection signal SEL 703 can also serve as an inverted input to a gate terminal of a transistor within the second column of transistors 904. The source terminal of the transistor at which SEL 703 is received may be coupled to the drain terminal of another transistor within the second column of transistors 904. In a third column of transistors 905, SEL 907 can be received at the gate terminal of another transistor. The source terminal of the transistor at which SEL 704 is received may be coupled to a drain terminal of a separate transistor within the third column of transistors 905. The source terminal of this second transistor may be coupled to an inverted input to the gate terminal of the same transistor. The source terminal of this transistor may also be coupled to a drain terminal of a third transistor within the third column of transistors 905. The source terminal of this third transistor may be coupled to an inverted input to the gate terminal of the same transistor. The source terminal of this third transistor within the third column of transistors 905 may also be coupled to a VAST voltage node 909. In the example shown in FIG. 9, the VAST voltage node 909 is also coupled to the second transistor within the second column of transistors 904 and the metal resistor 902 within the first column of transistors 903.

In the example of the present disclosure, the PMOS voltage limiter circuit 701 behaves differently based upon the high voltage signal HV 705 and the voltage threshold selection signals (906, 907). For example, during a low voltage memory operating condition (e.g., a memory operating voltage less than or equal to 0.9 V), the high voltage signal HV 705 is set to low ("0") and the circuit behaves as if no voltage limiter circuit was present. This is because high voltage signal HV 705 is coupled to an inverted gate input at a transistor 910 that is directly coupled to VAST node 909. However, during a high voltage memory operating condition (e.g., a memory operating voltage greater than 0.9 V), the high voltage signal HV 705 is set to high ("1"). In this case, the transistor 911 coupled to the high voltage signal HV 705 through a buffer will be enabled and the voltage at the VAST node 909 will be determined based on the settings of the voltage threshold selection signals SEL[1:0], as further described in the discussion of FIG. 12.

Figure 10:
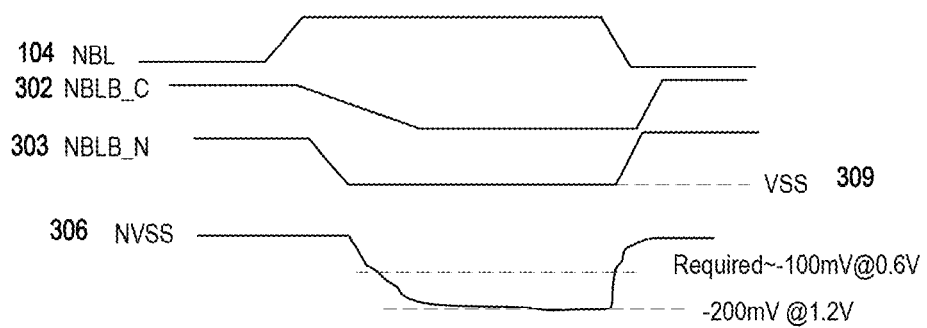
FIG. 10 is a timing diagram of various signals within the PMOS voltage limiter circuit in accordance with embodiments.

FIG. 10 is a timing diagram of the waveforms of the negative bit line input signal NBL 104, the voltage of the first negative bit line node NBLB_C 302, the voltage at the second negative bit line node NBLB_N 303, and the voltage at the ground source node NVSS 306, in accordance with embodiments. In the example shown in FIG. 10, the negative bit line input signal NBL 104 begins to rise. For example, the negative bit line input signal NBL 104 may begin to rise after the control circuit 106 indicates an initiation of a write operation. After the negative bit line input signal NBL 104 begins to rise, the voltage of the first negative bit line node NBLB_C 302 begins to decrease. This is because the negative bit line input signal NBL 104 is coupled to an inverted gate terminal of a transistor 404 that is also coupled to the first negative bit line node NBLB_C 302, as shown in FIG. 4. Thus, when the negative bit line input signal NBL 104 increases to logic high ("1"), the transistor 404 ceases to couple voltage from supply voltage VDD 111 to first node NBLB_C 302, causing the voltage at this first node NBLB_C 302 to decrease. The voltage of the first negative bit line node NBLB_C 302 decreases over a longer period of time than the negative bit line input signal NBL 104 rises due to the effect of the capacitor 301. The voltage at the second negative bit line node NBLB_N 303 also decreases after the negative bit line input signal NBL 104 rises because this second node NBLB_N 303 is coupled to a transistor, the gate terminal of which is coupled to an inverted negative bit line input signal NBL 104. This is because when the negative bit line input signal NBL 104 increases to logic high ("1"), the transistor ceases to couple voltage from supply voltage VDD 111 to the second negative bit line node NBLB_N 303, causing the voltage at this second node NBLB_N 303 to decrease. Ground source node NVSS 306 is also shown in FIG. 10. Because the PMOS voltage limiter circuit 701 clamps the first node NBLB_C 302 of an active low negative bit line at a predefined voltage level, the magnitude of the ground source node voltage NVSS is limited. This is because ground source node NVSS 306 is coupled to the first node NBLB_C 302 by way of a capacitor 301, and there may be a constant voltage drop across capacitor 301. In this example, the ground source node NVSS voltage is limited to not decrease below −200 mV at a memory operating voltage of 1.2 V. In this example, the memory operating voltage of 1.2 V represents a high memory operating voltage.

Figures 11, 12:
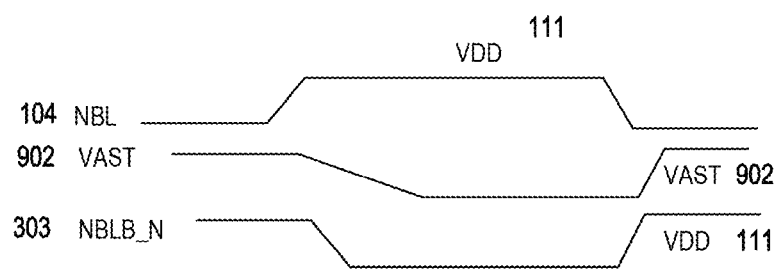
FIG. 11 is a timing diagram of an operation of the PMOS voltage limiter circuit during a low operating voltage mode in accordance with embodiments.
FIG. 12 is a table demonstrating the relationship between the voltage threshold selection signals and the voltage at a node within a PMOS voltage limiter circuit in accordance with embodiments.

FIG. 11 is a timing diagram of an operation of the PMOS voltage limiter circuit 701 during a low operating voltage mode, in accordance with embodiments. During a low operating voltage mode, the high voltage signal HV 705 is set to "0", and the voltage at the ground source node NVSS is the same as if a voltage limiter circuit was not present. This is because the VAST voltage is equal to the voltage at the supply voltage node VDD 111. When negative bit line input signal NBL 104 rises, the VAST voltage node 902 will decrease to logic low ("0"). This is because the high voltage signal HV 705 is coupled to an inverted gate terminal of transistor 910. Thus, when the high voltage signal HV 705 is at logic low ("0"), the transistor 910 will conduct and effectively short the circuit to the VAST voltage node 902. The VAST voltage node 902 will decrease more slowly than the second negative bit line node NBLB_N due to the effect of capacitor 301. The capacitor 301 will begin discharging when the high voltage signal HV 705 goes to logic low ("0"), and thus the VAST voltage node, which is coupled to the capacitor 301, will decrease at a rate that is dependent upon the time constant of capacitor 301, as understood by one skilled in the art. This is demonstrated in FIG. 8.

FIG. 12 is a table 1200 demonstrating the relationship between the voltage threshold selection signals 702 and the VAST voltage for the PMOS voltage limiter circuit 701 when HV 705 is set at a value of 1, according to one embodiment of the present disclosure. In one example, when SEL[0] is 0 and SEL[1] is also 0, the VAST voltage may be between 0.8 and 1 V. In another example, when SEL [0] is 0 and SEL[1] is 1, the output of the inverted logic (AND) gate of the PMOS voltage limiter circuit is enabled, and thus the first column of transistors 903 with the metal resistor 902 is disabled. The second column of transistors 904 is enabled due to SEL[0] being received at an inverted gate terminal of a transistor in the second column of transistors 904. The third column of transistors 905, however, is disabled in this example due to the SEL[1] at a high value being received at an inverted gate terminal of a transistor. In the example shown in FIG. 12, the VAST voltage may be 1.0 V during this case when SEL[0] is 0 and SEL[1] is 1. In another example of an operation of the PMOS voltage limiter circuit 701, SEL[0] may be set to 1 and SEL[1] may be set to 0. In this case, the VAST voltage may be 0.8 V. In another example, when SEL[0] is 1 and SEL[1] is also 1, the VAST voltage may be determined by the value of the resistance. This is because the second 904 and third 905 columns of transistors receive the respective voltage threshold selection signals 702 as inverted inputs to the gate terminals at transistors in each column. However, both SEL[0] and SEL[1] being set to 1 disables the output of the inverted AND gate, which is received as an inverted input at the gate terminal of the transistor within the first column of transistors 903, which is coupled in series with the metal resistor 902. In one example, the VAST voltage when both voltage threshold selection signals are set to 1 may be 1.1 V.

The size of each PMOS and the number of PMOSs in the PMOS voltage limiter circuit 701 may be modified based on the chosen design. For example, the size of each PMOS may be identical in one embodiment, and different in another embodiment. In another embodiment, the columns of the PMOS voltage limiter circuit 701 may include all metal resistors. For example, a middle column, which can be enabled when SEL[0] is set to 0, may include one or more PMOSs. A right column, which can be enabled when SEL[1] is set to 0, may include one or more PMOSs.

Figure 13:
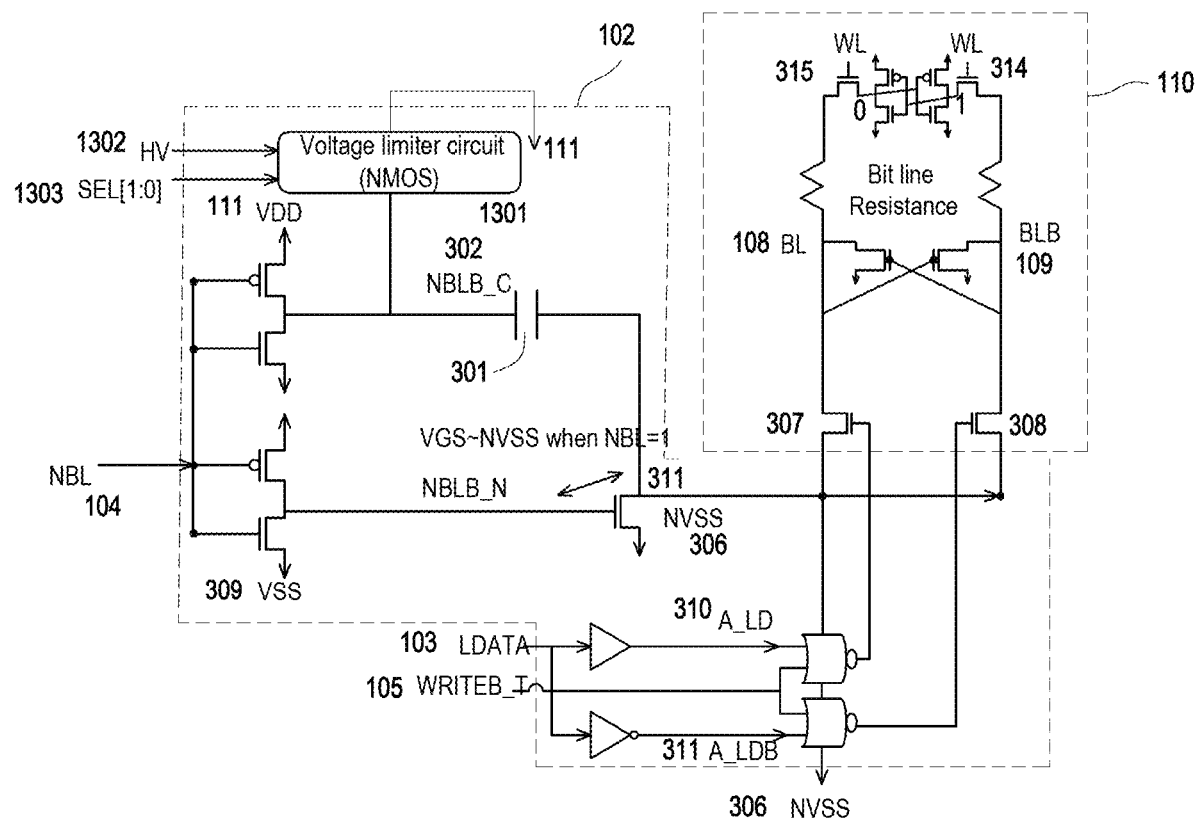
FIG. 13 is a diagram of one embodiment of a voltage limiter circuit, an NMOS voltage limiter circuit in accordance with embodiments.

FIG. 13 is a diagram of one embodiment of a voltage limiter circuit, an NMOS voltage limiter circuit 1301, in accordance with embodiments. In one embodiment of the present disclosure, the NMOS voltage limiter circuit 1301 is coupled to the first negative bit line input node NBLB_C 302. The NMOS voltage limiter circuit 1301 may be configured to receive a plurality of voltage threshold selection signals 1303 and a high voltage signal HV 1302 that is enabled during a high voltage operating mode. The NMOS voltage limiter circuit 1301 may be implemented in the write driver 102 to clamp a first node NBLB_C 302 at a predefined voltage level. The node 302 may be configured to provide a transition of the negative bit line voltage over a period of time. In one example, this predefined voltage level is a level less than an supply voltage VDD 111. For example, at a high operating voltage mode, the supply voltage VDD 111 may be 1.2 V. However, the NMOS voltage limiter circuit 1301 may be configured to provide a voltage drop between supply voltage VDD 111 and first node NBLB_C 302. In one example, this voltage drop may be 200 mV. Thus, the voltage at first node NBLB_C 302 may be 1.0 V. This value is obtained by subtracting the voltage drop of 200 mV from the supply voltage VDD 111 of 1.2 V. Thus, when the voltage at first node 302 decreases following a rising negative bit line input signal NBL 104, the voltage at first node 302 will only decrease by 1.0 V, from 1.0 V to 0 V. This decrease in the magnitude of the voltage decrease at first node 302 may induce a lower magnitude of negative voltage at ground source node 306. For instance, in the example above in which the supply voltage VDD 111 is 1.2 V and the voltage drop across the NMOS voltage limiter circuit 1301 is 200 mV, the voltage at ground source node NVSS 306 may have a magnitude of −100 mV. By contrast, when the first node NBLB_C 302 is not clamped at a voltage less than supply voltage VDD 111, and first node NBLB_C 302 is at 1.2 V, the voltage at ground source node NVSS 306 may have a magnitude of −200 mV. The exact value of the voltage at ground source node NVSS 306 may also be a function of the capacitance of capacitor 301, as understood by one skilled in the art.

Figure 14:
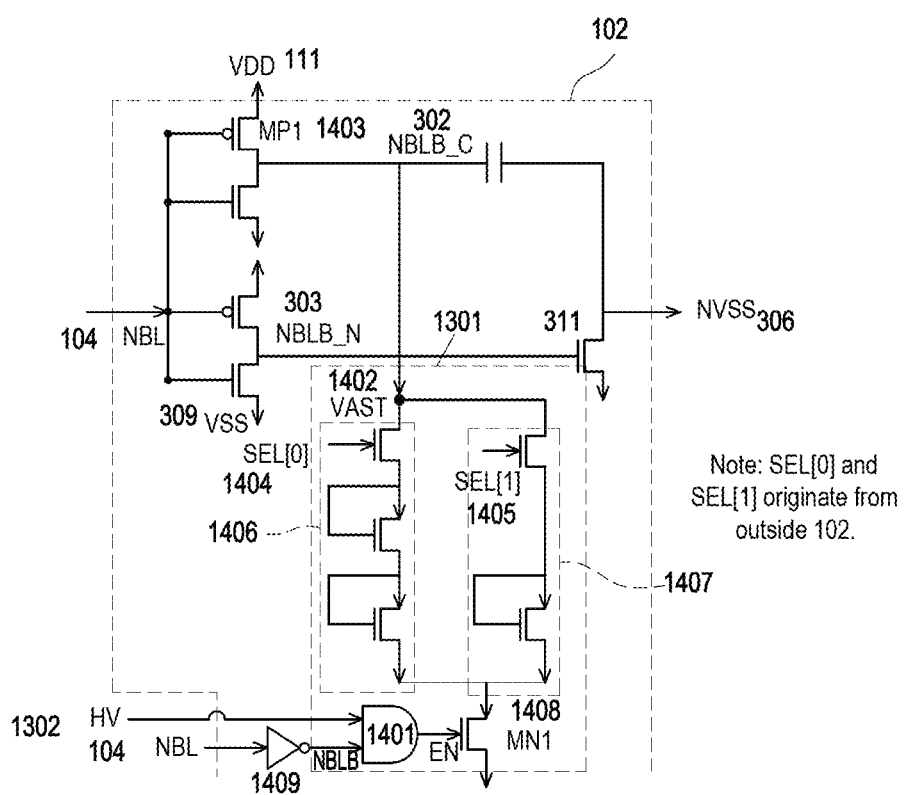
FIG. 14 is a detailed diagram of an NMOS voltage limiter circuit in accordance with embodiments.

FIG. 14 is a detailed diagram of the NMOS voltage limiter circuit 1301 displayed in FIG. 13, in accordance with embodiments. In an embodiment of the present disclosure, the NMOS voltage limiter circuit 1301 includes a first column of transistors 1406 and a second column of transistors 1407. In one example, a high voltage signal HV 1302 may serve as an input to a logic (AND) gate 1401. A negative bit line input signal NBL 104 may be coupled to a buffer 1409, and the output of this buffer 1409 may be inverted and serve as another input to the logic (AND) gate 1401. The output of this logic (AND) gate 1401 may be coupled to the gate terminal of a first transistor MN1 1408. In the example shown in FIG. 14, the transistor MN1 1408 is coupled to the drain terminals of transistors in both the first 1406 and second 1407 column of transistors. Voltage threshold selection signal SEL[0] 1404 may be received at a gate terminal of a transistor within the first column 1406 of transistors. Similarly, voltage threshold selection signal SEL[1] 1405 may be received at a gate terminal of a transistor within the second column 1407 of transistors. The source terminals of each of these transistors, as in the example shown in FIG. 14, may be coupled to a VAST voltage node 1402. The drain terminals of these transistors may be coupled to source terminals of additional transistors within the respective columns (1406, 1407).

The operation of the voltage limiter circuit 1301 shown in FIG. 14 may be the following. During a low voltage operating mode, the high voltage signal HV 1302 is set to low ("0"), and the MN1 transistor 1408 is disabled. Thus, the circuit behaves the same as it would in the absence of a voltage limiter circuit. During a high voltage operating mode, the high voltage signal HV 1302 is set to high ("1"). With the high voltage signal HV 1302 set to 1, the MN1 transistor 1408 is enabled when the negative bit line input signal NBL 104 is set to logic low ("0"). In this case, the value of the voltage at the VAST node 1402 is determined by the ratio of the size of MP1 1403 and the diode size based on the voltage threshold selection signals SEL[0] 1404 and SEL[1] 1405. In other embodiments of the present disclosure, the size and number of NMOS transistors may be varied according to the design. Depending on the particular design and application of the circuit, the size of each NMOS transistor may be different or identical. In addition, the number of NMOS transistors in each path may be different or identical. For example, there may be more transistors, or larger transistors, in third column 905 when the design requires a relatively lower voltage at VAST node 1402 when SEL[1] is at logic low ("0"). By contrast, there may be less transistors, or smaller transistors, in third column 905 when the design requires a relatively higher voltage at VAST node 1402 when SEL[1] is at logic low ("0").

Figures 15, 16:
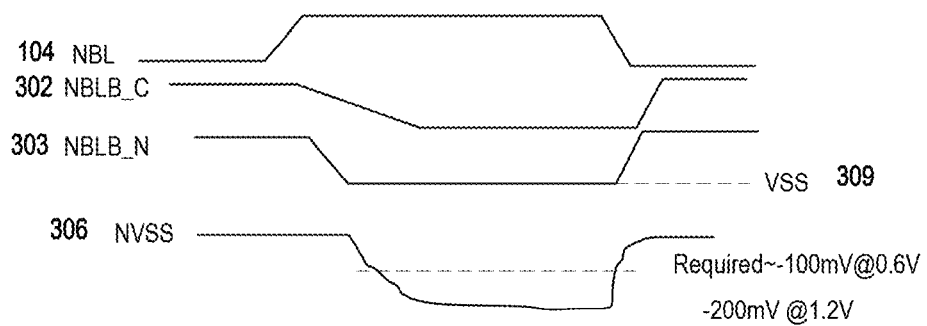
FIG. 15 is a timing diagram demonstrating the relationship between various signals within the NMOS voltage limiter circuit in accordance with embodiments.
FIG. 16 is a table demonstrating the relationship between various signals within the NMOS voltage limiter circuit in accordance with embodiments.

FIG. 15 is a timing diagram demonstrating the relationship between a negative bit line input signal 104, the voltage at a node 302 configured to provide a transition of the negative bit line over a period of time, the voltage at a second node NBLB_N 303 of an active low negative bit line, and a ground source node 306, in accordance with embodiments. In the example shown in FIG. 15, the negative bit line input signal rises. For example, the negative bit line input signal NBL 104 may begin to rise after the control circuit 106 indicates an initiation of a write operation. After the negative bit line input signal begins to rise, the voltage at a first node 302 configured to provide a transition of the negative bit line over a period of time begins to decrease. This is because the negative bit line input signal NBL 104 is coupled to an inverted gate terminal of a transistor 1403 that is also coupled to the first negative bit line node NBLB_C 302, as shown in FIG. 14. Thus, when the negative bit line input signal NBL 104 increases to logic high ("1"), the transistor 1403 ceases to couple voltage from supply voltage VDD 111 to first node NBLB_C 302, causing the voltage at this first node NBLB_C 302 to decrease. The voltage at the second node NBLB_N 303 of the active low negative bit line begins to decrease thereafter. The ground source node NVSS then decreases, but in the present example is limited at −200 mV because of the NMOS voltage limiter circuit 1301. The operation demonstrated in FIG. 15 is at an operating voltage of 1.2 V, which is considered a high operating voltage mode in the present disclosure.

FIG. 16 is a table 1600 demonstrating the relationship between the voltage threshold selection signals 1303 and the VAST voltage for the NMOS voltage limiter circuit 1301 when HV is set at a value of 1, according to one embodiment of the present disclosure. In one example, when SEL[0] is 0 and SEL[1] is also 0, the first and second columns of transistors in the NMOS voltage limiter circuit are disabled. Thus, the VAST voltage is 1.2 V, the same as the operating voltage of the present disclosure. In another example, when SEL [0] is 0 and SEL[1] is 1, the second column of transistors 1407 is enabled and the VAST voltage may be clamped at a voltage of 1.0 V. In another example, when SEL[0] is 1 and SEL[1] is 0, the first column of transistors 1406 is enabled and the VAST voltage node 1402 may be 0.8 V. In another example, when SEL[0] is 1 and SEL[1] is also 1, the VAST voltage may be between 0.8 and 1.0 V.

Figure 17:
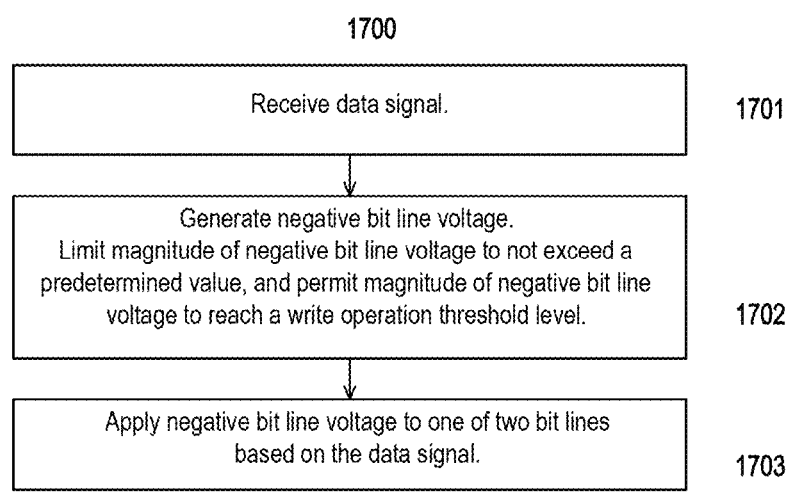
FIG. 17 is a flow chart of a method of operating a write driver in accordance with embodiments.

FIG. 17 is a flow chart 1700 of a method of operating a write driver according to one embodiment of the present disclosure. In an example of the present disclosure, the first step 1701 in operating a write driver is to receive a data signal. The data signal may be, for example, LDATA 103. This data signal LDATA 103 may be received by a write driver. The second step 1702 is to generate a negative bit line voltage. The negative bit line voltage may be generated, for example, by a negative bit line input signal NBL 104. The magnitude of the negative bit line voltage may be limited to not exceed a predetermined value, while being permitted to reach a write operation threshold level. The limiting of the magnitude of the negative bit line voltage may be accomplished by a voltage limiter circuit, for example the voltage limiter circuit 101 of the present disclosure. Following the generation of the negative bit line voltage, negative bit line voltage may be applied to one of two bit lines, as shown in the third step 1703.

The foregoing detailed description discloses, in embodiments, a write driver that is configured to receive a data signal, a write signal, and a negative bit line input signal and to generate a negative bit line voltage to one of two bit lines of a memory cell. The write driver may include a capacitor that is responsive to a first node configured to provide a transition of the negative bit line voltage over a period of time. The write driver may also include a voltage limiter circuit that is configured to control a voltage at the first node. This voltage limiter circuit may be configured to limit a magnitude of the negative bit line voltage on one of the two bit lines of the memory cell such that the magnitude does not exceed a predefined threshold.

The voltage limiter circuit may be further configured to limit the magnitude of the negative bit line voltage while permitting the negative bit line voltage to reach a write operation threshold level. The voltage limiter circuit may also be further configured to reduce an active power of an SRAM cell at a high operating voltage mode. In one example, the write driver may be coupled to a memory array that is configured to receive the negative bit line voltage and to perform a write operation to the memory cell. The memory array may include one or more transistors and the two bit lines. The write driver may also be coupled to a control circuit that is configured to generate the negative bit line input signal and the write signal and a data latch that is configured to generate the data signal. Each of the two bit lines of the write driver may further include a pass gate MOSFET that is configured to transfer the one or more write operation data signals from the write driver to the memory array. The write driver may be configured to increase the gate to source voltage of the pass gate MOSFET.

In one example of the present disclosure, the voltage limiter circuit of the write driver includes a diode circuit that is configured to clamp the aforementioned first node at a predefined voltage level. The diode circuit may include a transistor. The source terminal of this transistor may be coupled to the supply voltage node. The drain terminal of this transistor may be coupled to the active low negative bit line, and the active low negative bit line may be coupled to the first node.

In another example of the present disclosure, the voltage limiter circuit of the write driver may include an array of transistors that is configured to receive a plurality of voltage threshold selection signals and to clamp the node of an active low negative bit line at one of a plurality of predefined voltage levels that are each lower than an operating voltage of a SRAM cell based upon the plurality of voltage threshold selection signals. In one example, the plurality of voltage threshold selection signals may be received at the gate terminal of one or more transistors within the array of transistors. This array of transistors may be coupled to the active low negative bit line, and the active low negative bit line may be coupled to the first node.

The foregoing detailed description also discloses a method of operating a write driver in an embodiment. In one example, the first step in operating a write driver is to receive a data signal. The next step is to generate a negative bit line voltage. The magnitude of this negative bit line voltage may be limited to not exceed a predetermined value, and permitted to reach a write operation threshold level. The next step in this example is to apply the negative bit line voltage to one of two bit lines based upon the data signal. The step of limiting the magnitude of the negative bit line voltage may be accomplished during a high operating voltage mode of a SRAM cell. An additional step of this method may include determining the magnitude of the negative bit line voltage necessary for performing a successful write operation. The method may result in a reduction of an active power of the SRAM cell.

The foregoing detailed description also discloses a memory circuit. In an example embodiment, the memory circuit includes a memory array including a plurality of transistors and a plurality of bit lines that form a plurality of memory cells. The memory array may be configured to receive one or more write operation data signals and to perform a write operation to a memory location. The memory circuit may also include a write driver that is configured to receive a data signal, a write signal, and a negative bit line input signal and to generate the one or more write operation data signals including a negative bit line voltage to one of two bit lines of a particular memory cell, the write driver comprising a capacitor configured to provide a transition of the negative bit line voltage over a period of time and a voltage limiter circuit configured to limit a magnitude of the negative bit line voltage on said one of the two bit lines of the memory cell.

In one example, each of the aforementioned bit lines may further comprise a pass gate MOSFET configured to transfer the one or more write operation data signals from a write driver to the memory array. The memory circuit may also include a control circuit that is configured to receive a clock signal and an address signal and to generate the negative bit line input signal and the write signal, as well as a data latch that is configured to generate the data signal.

In one embodiment of the present disclosure, the voltage limiter circuit may include a diode circuit that is configured to clamp a node of an active low negative bit line at a predefined voltage level such as to limit the magnitude of negative voltage that is coupled to the one of the two bit lines to not exceed a predefined threshold.

In another embodiment of the present disclosure, the voltage limiter circuit may include an array of transistors that is configured to clamp a node of an active low negative bit line at one of a plurality of predefined voltage levels that are each lower than an operating voltage of the SRAM cell. In one example, the array of transistors may be configured to receive a plurality of voltage threshold selection signals and to clamp the node of the active low negative bit line at one of the plurality of predefined voltage levels based upon the plurality of voltage threshold selection signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A write driver configured to receive a data signal, a write signal, and a negative bit line input signal and to generate a negative bit line voltage to one of two bit lines of a memory cell, the write driver comprising:
    a capacitor responsive to a first node configured to provide a transition of the negative bit line voltage over a period of time; and
    a voltage limiter circuit configured to control a voltage at the first node, the voltage limiter circuit being configured to limit a magnitude of the negative bit line voltage on said one of the two bit lines of the memory cell such that the magnitude does not exceed a predefined threshold.

2. The write driver of claim 1, wherein the voltage limiter circuit is further configured to limit the magnitude of the negative bit line voltage while permitting the negative bit line voltage to reach a write operation threshold level.

3. The write driver of claim 1, wherein the voltage limiter circuit is further configured to reduce an active power of an SRAM cell at a high operating voltage mode.

4. The write driver of claim 1, the write driver being coupled to:
    a memory array configured to receive the negative bit line voltage and to perform a write operation to the memory cell, the memory array including one or more transistors and the two bit lines;
    a control circuit configured to generate the negative bit line input signal and the write signal; and
    a data latch configured to generate the data signal.

5. The write driver of claim 3, wherein each of the two bit lines further comprise a pass gate MOSFET configured to transfer one or more write operation data signals from the write driver to the memory array.

6. The write driver of claim 5, wherein the negative bit line voltage increases a gate to source voltage of the pass gate MOSFET.

7. The write driver of claim 4, wherein the voltage limiter circuit comprises a diode circuit configured to clamp the first node at a predefined voltage level.

8. The write driver of claim 7, wherein the diode circuit comprises a transistor, and wherein:
    the source terminal of the transistor is coupled to a supply voltage node;
    the drain terminal of the transistor is coupled to the active low negative bit line; and
    the active low negative bit line is coupled to the first node.

9. The write driver of claim 4, wherein the voltage limiter circuit comprises an array of transistors configured to receive a plurality of voltage threshold selection signals and to clamp the node of an active low negative bit line at one of a plurality of predefined voltage levels that are each lower than an operating voltage of a SRAM cell based upon the plurality of voltage threshold selection signals.

10. The write driver of claim 9, wherein:
    the plurality of voltage threshold selection signals is received at the gate terminal of one or more transistors within the array of transistors;
    the array of transistors is coupled to the active low negative bit line; and
    the active low negative bit line is coupled to the first node.

11. A method of operating a write driver, comprising:
    receiving a data signal;
    generating a negative bit line voltage, wherein the magnitude of the negative bit line voltage is limited to not exceed a predetermined value and permitted to reach a write operation threshold level; and
    applying the negative bit line voltage to one of two bit lines based on the data signal.

12. The method of claim 11, wherein the step of limiting the magnitude of the negative bit line voltage is accomplished during a high operating voltage mode of a SRAM cell.

13. The method of claim 11, further comprising determining the magnitude of the negative bit line voltage necessary for performing a successful write operation.

14. The method of claim 12, the method reducing an active power of the SRAM cell.

15. A memory circuit, comprising:
a memory array including a plurality of transistors and a plurality of bit lines that form a plurality of memory cells, the memory array being configured to receive one or more write operation data signals and to perform a write operation to a memory location; and
a write driver configured to receive a data signal, a write signal, and a negative bit line input signal and to generate the one or more write operation data signals including a negative bit line voltage to one of two bit lines of a particular memory cell, the write driver comprising a capacitor configured to provide a transition of the negative bit line voltage over a period of time and a voltage limiter circuit configured to limit a magnitude of the negative bit line voltage on said one of the two bit lines of the memory cell.

16. The memory circuit of claim 15, wherein each of the one or more bit lines further comprise a pass gate MOSFET configured to transfer the one or more write operation data signals from a write driver to the memory array.

17. The memory circuit of claim 15, the memory circuit further comprising:

a control circuit configured to receive a clock signal and an address signal and to generate the negative bit line input signal and the write signal; and
a data latch configured to generate the data signal.

18. The memory circuit of claim 15, the voltage limiter circuit comprising a diode circuit configured to clamp a node of an active low negative bit line at a predefined voltage level such as to limit the magnitude of negative voltage that is coupled to the one of the two bit lines to not exceed a predefined threshold.

19. The memory circuit of claim 15, wherein the voltage limiter circuit comprises an array of transistors configured to clamp a node of an active low negative bit line at one of a plurality of predefined voltage levels that are each lower than an operating voltage of the SRAM cell.

20. The memory circuit of claim 19, wherein the array of transistors is configured to receive a plurality of voltage threshold selection signals and to clamp the node of the active low negative bit line at one of the plurality of predefined voltage levels based upon the plurality of voltage threshold selection signals.

* * * * *